(12) United States Patent
Xu et al.

(10) Patent No.: US 7,911,247 B2
(45) Date of Patent: Mar. 22, 2011

(54) DELTA-SIGMA MODULATOR CLOCK DITHERING IN A FRACTIONAL-N PHASE-LOCKED LOOP

(75) Inventors: Yang Xu, Chicago, IL (US); Gang Zhang, San Diego, CA (US); Prasad S. Gudem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/037,503

(22) Filed: Feb. 26, 2008

(65) Prior Publication Data

US 2009/0212835 A1 Aug. 27, 2009

(51) Int. Cl.
*H03L 7/06* (2006.01)
(52) U.S. Cl. .................................................... 327/156
(58) Field of Classification Search ............... 327/156
See application file for complete search history.

(56) References Cited

U.S. PATENT DOCUMENTS

| | | | | |
|---|---|---|---|---|
| 5,084,901 A | * | 1/1992 | Nagazumi | 375/139 |
| 6,606,004 B2 | * | 8/2003 | Staszewski et al. | 331/17 |
| 2003/0137359 A1 | * | 7/2003 | Patana | 331/100 |

OTHER PUBLICATIONS

Perrott, Michael H. et al., "A 27-mW CMOS Fractional-N Synthesizer Using Digital Compensation for 2.5-Mb/s GFSK Modulation," IEEE Journal of Solid-State Circuits, vol. 32, No. 12, Dec. 1997.

Galton, Ian, "Granular Quantization Noise in a Class of Delta-Sigma Modulators," IEEE Transactions on Information Theory, vol. 40, No. 3, May 1994.
Damphousse, Simon et al., "All Digital Spread Spectrum Clock Generator for EMI Reduction," ISSCC 2006, Session 14, Baseband and Channel Procession, 14.2, 2006 IEEE International Solid-State Circuits Conference.
Lee, Thomas H., "The Design of CMOS Radio-Frequency Integrated Circuits," Cambridge University Press, pp. 519-521, 1998.

* cited by examiner

*Primary Examiner* — Lincoln Donovan
*Assistant Examiner* — Daniel Rojas
(74) *Attorney, Agent, or Firm* — Jiayu Xu (57) ABSTRACT

The clock signal supplied to the delta-sigma modulator in a fractional-N phase-locked loop is dithered. In one example, the PLL includes a novel programmable clock dithering circuit. The programmable clock dithering circuit is controllable via a serial bus to dither the phase of the clock signal in a selected one of several ways. If the clock signal is dithered in a first way (pseudo-random phase dithering), then the power of digital noise generated by the delta-sigma modulator is spread over a frequency band, thereby reducing the degree to which the noise interferes with other circuitry. If the clock signal is dithered in a second way (rotational phase dithering), then the power of digital noise is frequency shifted such that the degree to which the noise interferes with the other circuitry is reduced. The programmable clock dithering circuit can be controlled in other ways. For example, dithering can be programmably disabled.

36 Claims, 5 Drawing Sheets

(PRIOR ART)

DELTA-SIGMA MODULATOR CLOCK DITHERING IN A FRACTIONAL-N PHASE-LOCKED LOOP

BACKGROUND INFORMATION

1. Technical Field

The disclosed embodiments relate to phase-locked loops (PLLs).

2. Background Information

Figure 1:
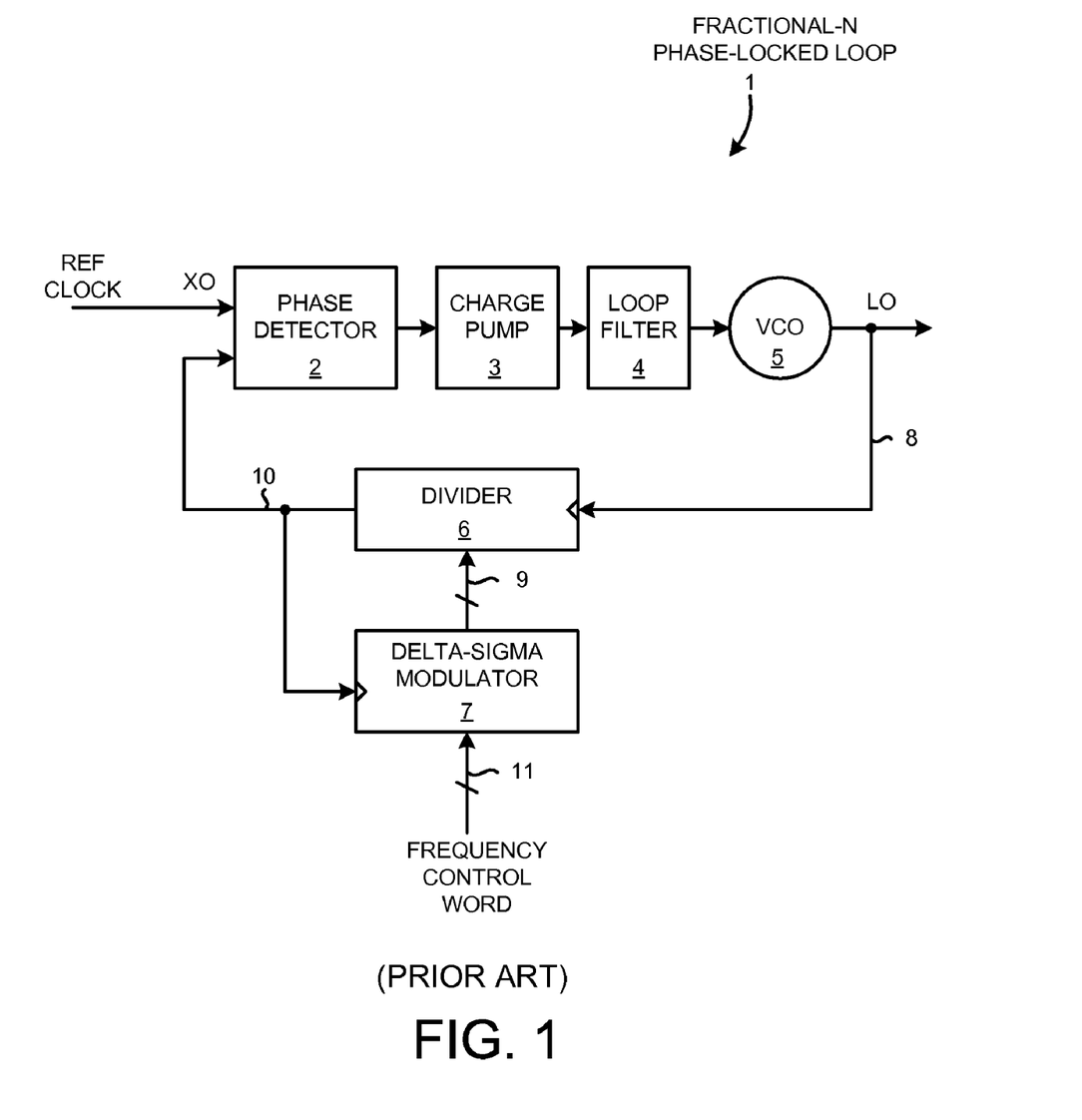
FIG. 1 (Prior Art) is a simplified block diagram of a conventional fractional-N phase-locked loop.

Phase-locked loops (PLLs) are used in many applications, including use in local oscillators of cellular telephone receivers and transmitters. FIG. 1 (Prior Art) is a simplified diagram of one such type of PLL 1. This type of PLL may, for example, be used to tune the frequency of a local oscillator (LO) signal, where the LO signal is supplied to a mixer of a receiver in the cellular telephone such that the receiver is tuned to receive a radio signal of interest. PLL 1 includes a phase detector 2, a charge pump 3, a loop filter 4, a voltage-controlled oscillator (VCO) 5, a divider 6, and a delta-sigma modulator 7 (also referred to as a sigma-delta modulator). Divider 6 divides the frequency of the LO signal on node 8 by a multi-bit digital divisor value received on leads 9, and outputs the resulting lower frequency feedback clock signal onto node 10. Delta-sigma modulator 7 varies the multi-bit digital divisor value on leads 9 over time such that the frequency of the LO signal on node 8 divided by the frequency of the feedback clock signal on node 10 is a fractional-N divisor value over time. The fractional-N divisor value can be changed by changing a multi-bit digital frequency control word received onto delta-sigma modulator 7 via leads 11. The frequency of the LO signal on node 8 is adjusted to tune the receiver by adjusting the multi-bit digital frequency control word. Improving the performance of PLLs such as PLL 1 of FIG. 1, and of circuits that contain such PLLs, is desired.

SUMMARY

A characteristic (for example, a phase) of a clock signal that clocks a delta-sigma modulator in a fractional-N phase-locked loop (PLL) is dithered.

In one specific embodiment, the PLL includes a novel programmable clock dithering circuit. The programmable clock dithering circuit is controllable via a serial bus to dither the phase of the clock signal in a selected one of several ways. In one example, a digital baseband integrated circuit controls dithering by sending control information via the serial bus to the novel programmable clock dithering circuit. If the programmable clock dithering circuit dithers the clock signal in a first way (pseudo-random phase dithering), then the phase of the clock signal is dithered to change in a pseudo-random fashion. The power of digital noise generated by the delta-sigma modulator is spread over a frequency band, thereby reducing the power of the digital noise at a particular frequency and thereby decreasing the degree to which the noise interferes with other circuitry. If the programmable clock dithering circuit dithers the clock signal in a second way (rotational phase dithering), then the phase of the clock signal is dithered to change in a smoothly varying fashion. The power of digital noise generated by the delta-sigma modulator is shifted in frequency such that the degree to which the noise interferes with the other circuitry is reduced.

Where the novel PLL is embodied in an RF transceiver such as the transceiver of a cellular telephone, the dithering may be controlled to reduce the degree to which digital noise generated by the delta-sigma modulator interferes with reception by the cellular telephone of desired radio signals and/or the degree to which digital noise generated by the delta-signal modulator interferes with transmission of desired radio signals. In one specific embodiment, the programmable clock dithering circuit is controllable in other ways as well. For example, the clock signal that is used as a source to generate the dithered clock signal can be controllably selected from one of several clock signals. The programmable clock dithering circuit can also be controlled to disable dithering such that the clock signal supplied to a delta-sigma modulator has a fixed frequency and fixed phase.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 2:
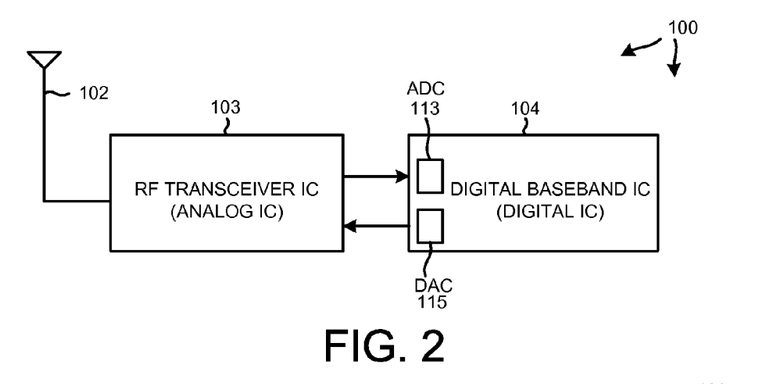
FIG. 2 is a very simplified high level block diagram of one particular type of mobile communication device 100 in accordance with one novel aspect.

FIG. 2 is a very simplified high level block diagram of one particular type of mobile communication device 100 in accordance with one novel aspect. In this particular example, mobile communication device 100 is a 3G cellular telephone that uses a Code Division Multiple Access (CDMA) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 3:
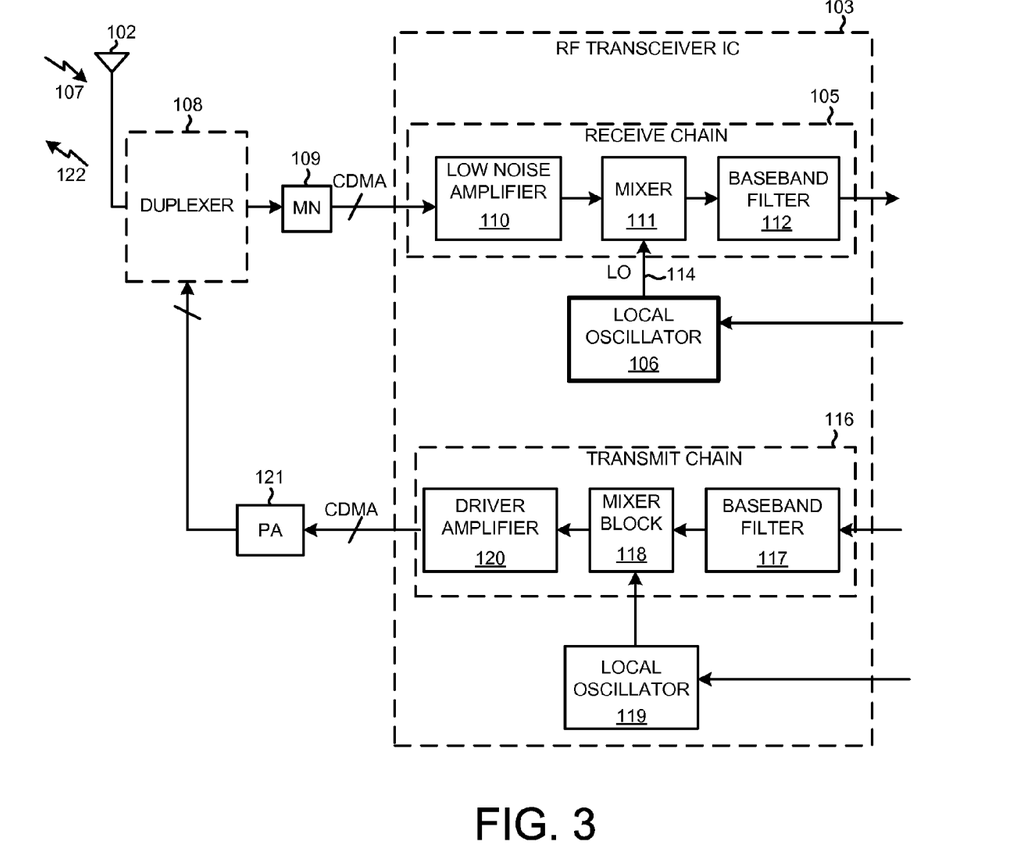
FIG. 3 is a more detailed block diagram of the RF transceiver integrated circuit 103 of FIG. 2.

FIG. 3 is a more detailed block diagram of the RF transceiver integrated circuit 103. The receiver includes what is called a "receive chain" 105 as well as a local oscillator (LO) 106. When the cellular telephone is receiving, a high frequency RF signal 107 is received on antenna 102. Information from signal 107 passes through duplexer 108, matching network 109, and through the receive chain 105. Signal 107 is amplified by low noise amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the local oscillator signal (LO) 114 supplied by local oscillator 106 to mixer 111.

If the cellular telephone is transmitting, then information to be transmitted is converted into analog form by a digital-to-analog converter 115 in the digital baseband integrated circuit 104 and is supplied to a "transmit chain" 116. Baseband filter 117 filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102.

Figure 4:
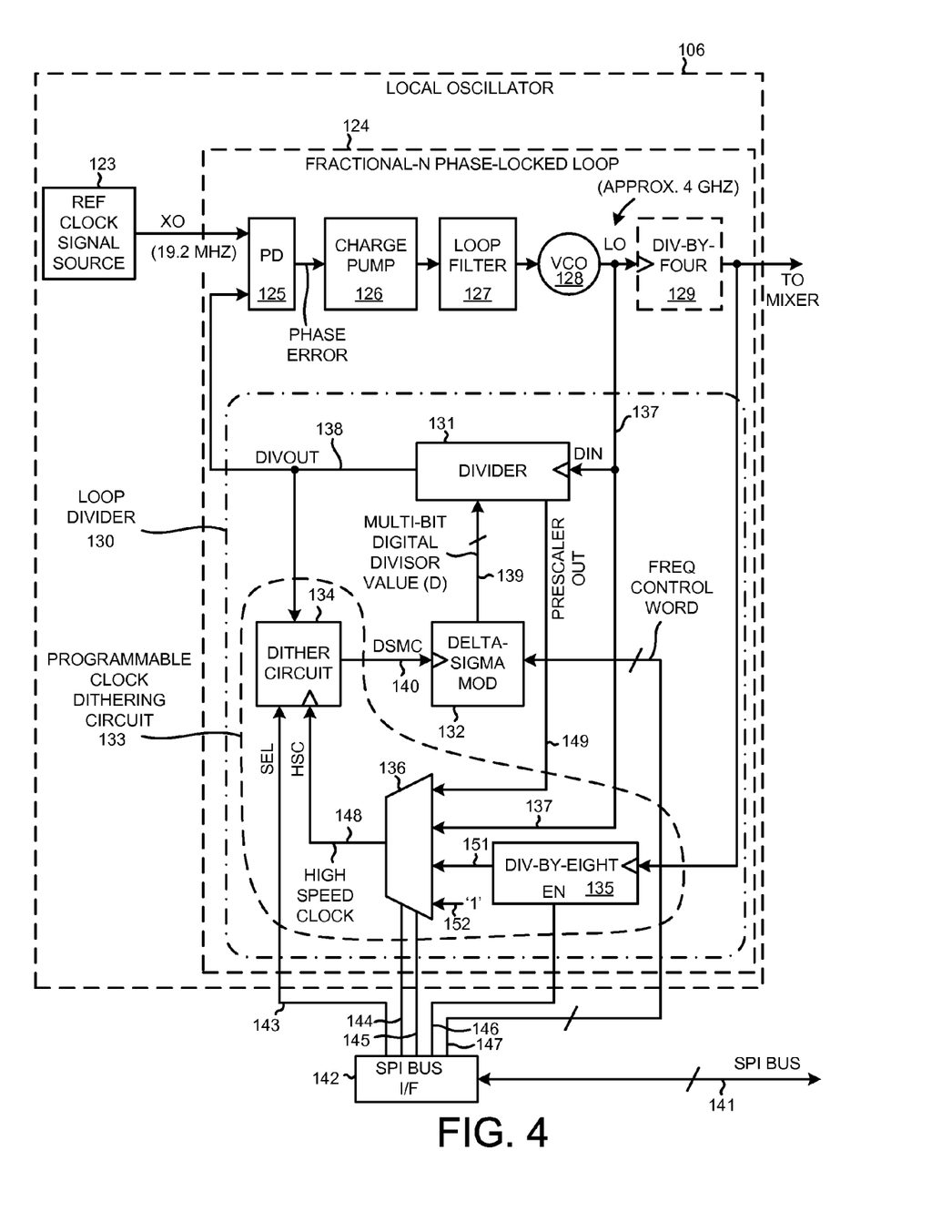
FIG. 4 is a more detailed block diagram of the local oscillator 106 of FIG. 3.

FIG. 4 is a more detailed diagram of local oscillator 106. Local oscillator 106 includes a reference clock signal source 123 and a fractional-N phase-locked loop (PLL) 124. In the present example, the reference clock signal source 123 is a connection to an external crystal oscillator module. Alternatively, the reference clock signal source 123 is an oscillator disposed on RF transceiver integrated circuit 102, where the crystal is external to integrated circuit 102 but is attached to the oscillator via terminals of the integrated circuit 102.

PLL 124 includes a phase-detector (PD) 125, a charge pump 126, a loop filter 127, a voltage controlled oscillator (VCO) 128, a signal conditioning output divider 129, and a loop divider 130 (sometimes called a "frequency divider"). Loop divider 130 receives a frequency divider input signal DIN of a first higher frequency F1, frequency divides the signal by a divisor value D, and outputs a frequency divider output signal DIVOUT of a second lower frequency F2. Over a plurality of count cycles of loop divider 130, F2=F1/D when the PLL is locked. When locked, the frequency F2 and phase of the DIVOUT signal matches the frequency and phase of the reference clock signal supplied from reference clock signal source 123.

Loop divider 130 includes a divider 131, a delta-sigma modulator 132 and a programmable clock dithering circuit 133. Programmable clock dithering circuit 133 in turn includes a dither circuit 134, a divider 135 and a multiplexer 136. Divider 131 divides the loop divider input signal DIN on input node(s) 137 by the multi-bit digital divisor value D and generates the loop divider output signal DIVOUT on output node(s) 138. Input nodes 137 may, for example, be a pair of nodes that carries a pair differential signals. Similarly, output nodes 138 may be a pair of nodes that carries a pair of differential signals. Delta-sigma modulator 132 varies the multi-bit digital divisor value D on input leads 139 such that over time the frequency of LO is divided by the fractional F value N.f. The "N" in the fractional F value "N.f" represents an integer, whereas the ".f" in the fractional value "N.f" represents a fractional value.

The functionality of blocks 125, 126, 127 and 128 of the phase-locked loop 124 can be realized in the form of an analog phase-locked loop of various designs, or as a so-called All-Digital Phase-Locked Loop (ADPLL) of various designs, or hybrids of analog and digital circuitry. In the particular example illustrated, phase detector 125, charge pump 126 and loop filer 127, and VCO are analog circuits. The frequency of reference clock signal XO is 19.2 MHz and the frequency of the VCO output signal LO on nodes 137 is approximately 4 GHz. The precise frequency of the VCO output signal LO on nodes 137 depends on the divisor by which loop divider 130. Because loop divider 130 frequency-divides by fractional F value N.f, the frequency of the signal LO is F2*(N.f). If, for example, N.f is 200.1, and F2 is 19.2 MHz, then the frequency F1 of LO is 3.84192 GHz.

In one novel aspect, programmable clock dithering circuit 133 dithers the phase of a delta-sigma modulator clock signal (DSMC) supplied on conductor 140 to delta-sigma modulator 132. In one type of conventional delta-sigma modulator in a local oscillator of a radio receiver, the conventional delta-sigma modulator is a large amount of digital logic that is clocked by single digital clock signal of a fixed frequency. The resulting substantially simultaneous clocking of many digital logic sequential logic elements and gates within the delta-sigma modulator generates substantial current pulses that pulse from power supply buses to ground buses. These current pulses can be large on the order of tens of milliamperes. Because the clocking of the digital logic is synchronized with the XO signal, the resulting current pulses give rise to digital noise and this digital noise may have high order harmonics that leak back into other parts of the receiver and interfere with reception of the desired signal. The leakage of such digital noise may, for example, occur through the power and ground buses that supply power to the digital logic of the delta-sigma modulator. Leakage may also occur through the semiconductor substrate of the RF transceiver integrated circuit. To combat deleterious effects of this noise, physical isolation techniques such as guard rings are typically employed to isolate the noisy delta-sigma modulator from other parts of the receiver circuitry and to prevent noise leakage. Conventional physical isolation techniques may, however, not be entirely effective in isolating high frequency harmonics of the digital noise that have frequencies of hundreds of megahertz or more.

Whereas in the conventional art the digital logic of a delta-sigma modulator within a local oscillator of a radio receiver was clocked by clock signal of a single frequency and phase, in the novel PLL 124 of FIG. 4 the programmable clock dithering circuit 133 dithers the phase of the delta-sigma modulator clock signal (DSMC) so that the clocking of the digital logic that makes up the delta-signal modulator 132 is also dithered in phase. By dithering the phase in an appropriate manner, the power of the unwanted noise is changed such that the undesired interference with the remainder of the circuitry of which the delta-sigma modulator is a part (in this case, a receiver) is reduced or eliminated completely. In the specific example of FIG. 4, programmable clock dithering circuit 133 is controlled to dither the clock signal in a selectable one of a plurality of ways. One way involves pseudo-randomly dithering the phase of the DSMC clock signal such that the power of the unwanted noise is spread out across a frequency band. Consequently the power of the unwanted noise is reduced at a particular frequency of interest. A second way involves rotationally dithering the phase of the DSMC clock signal such that the phase of the DSMC signal is scanned back and forth (or rotated) over a range. Rotationally dithering the phase serves to shift the power of the unwanted noise generated to a different frequency or to different frequencies. Consequently the power of the unwanted noise is reduced at a particular frequency of interest. A third way is to disable dithering such that the DSMC clock signal is not dithered.

In the specific implementation of FIG. 4, the way that the programmable clock dithering circuit 133 dithers the DSMC clock signal is controlled by the digital baseband IC 104 via serial SPI bus 141. Although not illustrated in FIGS. 2 and 3, an SPI bus 141 extends between digital baseband IC 104 and RF transceiver IC 103, and this bus is used by digital baseband IC 104 to send control information to RF transceiver IC 103.

This control information is received across SPI bus 141 and into SPI bus interface block 142. SPI interface 142 converts the control information into digital control signals that are supplied onto conductors 143-147. Conductors 147 in FIG. 4 represent conductors across which the frequency control word is communicated to the delta-sigma modulator. The frequency control word is supplied by digital baseband IC 104 to the delta-sigma modulator 132 across the same SPI bus 141 and SPI interface 142 as the control information that controls the programmable clock dithering circuit 133. The digital control signal SEL on conductor 143 selects which one of the pseudo-random dithering or rotational dithering it is that dither circuit 134 performs. The digital control signals on conductors 144 and 145 determine which one four signals is supplied as a "high speed clock" signal HSC by multiplexer 136 onto the clock input conductor 148 of dither circuit 134. The term high speed here is a relative term and is relative to the frequency of the DIVOUT signal. The four signals are: 1) a PRESCALER OUT clock signal that is output by the prescaler of divider 131 onto conductor 149, 2) the local oscillator (LO) clock signal that is output by VCO 128 onto conductor 137, 3) a clock signal output by divide-by-eight divider 135 onto conductor 151, and 4) a fixed digital "1" value on conductor 152. In the embodiment of FIG. 4, the frequency of the high speed clock signal HSC on conductor 148 determines the rate of dithering.

If multiplexer 136 is controlled to couple conductor 152 to clock input conductor 148, then the clock signal HSC on conductor 148 is stopped and dither circuit 134 is stopped, and the DSMC clock signal output by dither circuit 134 onto conductor 140 has a fixed frequency and phase. If the clock signal on conductor 151 is not being used as the source of the HSC clock signal supplied to dither circuit 134, then divider 135 can be disabled and powered-down by causing the control signal on conductor 146 to be digital low. Disabling divider 135 reduces power consumption of the PLL 124. If, on the other hand, divider 135 is to be enabled, then the control signal on conductor 146 is made to be a digital high so that divider 135 is powered and enabled. As illustrated in FIG. 4, the conductor 146 extends to the enable/disable input lead of divider 135. The values of the control signals on conductors 143-147 are independently controllable by digital baseband IC 104 via the SPI bus interface.

Figure 5:
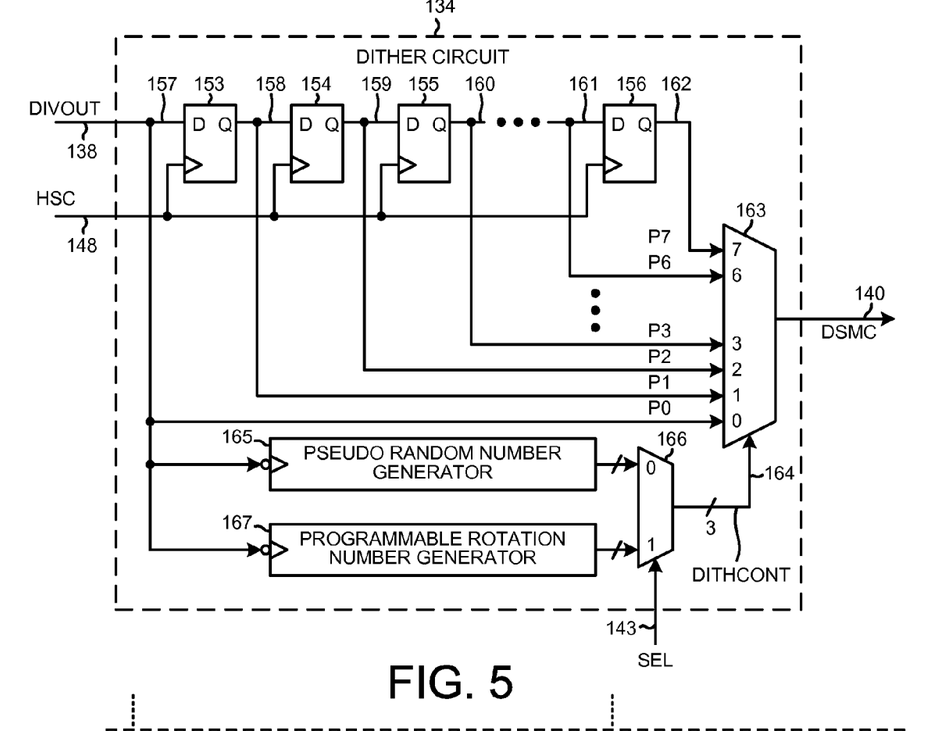
FIG. 5 is a more detailed block diagram of the dither circuit 134 of the programmable clock dithering circuit 133 of FIG. 4.

FIG. 5 is a more detailed diagram of one way to implement dither circuit 134 of FIG. 4. Dither circuit 134 includes string of sequential logic elements 153-156. All the sequential logic elements 153-156 in the string are clocked by the same high speed clock signal HSC that is received onto dither circuit 134 via conductor 148. The much slower clock signal DIVOUT is supplied on conductor 138 to the data input lead of the first sequential logic element 153 in the string such that the various taps 157-162 along the string output a corresponding set of delayed versions of the clock signal DIVOUT. The time delay between these delayed versions is the period of the higher speed HSC clock signal. The delayed versions of the signals are denoted P1-P7 in the illustration and are referred to as phase signals. P0 is not delayed. Multiplexer 163 is controlled by a three-bit digital word DITHCONT on conductors 164 to couple one of the phase signals P0-P7 onto the conductor 140 as the DSMC clock signal. By changing the DITHCONT word, the phase of the DSMC clock signal is changed. In the illustrated embodiment, if programmable clock dithering circuit 133 is to perform pseudo-random dithering, then the value SEL on conductor 143 is set to a digital low such that the three-bit value output by pseudo-random number generator 165 is supplied through multiplexer 166 onto conductors 164. If, on the other hand, programmable clock dithering circuit 133 is to perform rotational dithering, then the value SEL on conductor 143 is set to a digital high such that the three-bit value output by programmable rotation number generator 167 is supplied through multiplexer 166 onto conductors 164.

Figure 6:
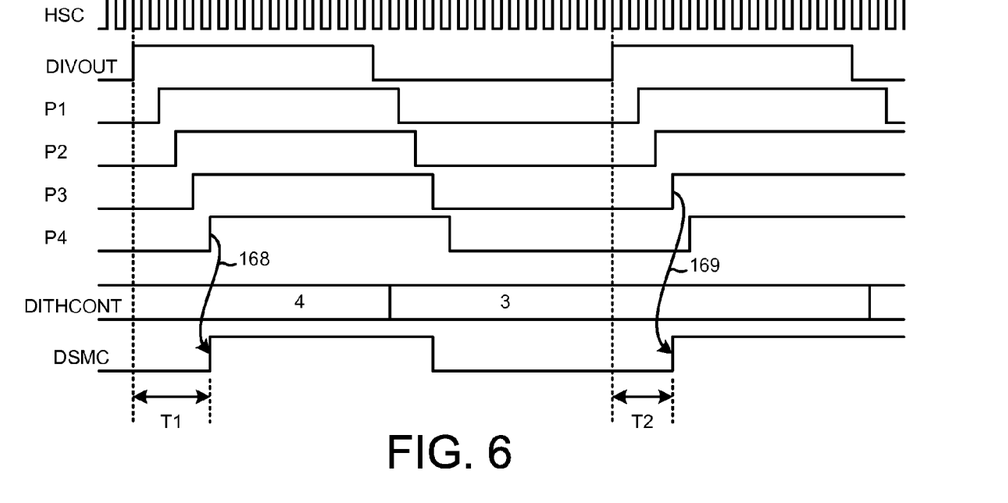
FIG. 6 is a waveform diagram that illustrates an operation of the dither circuit 134 of FIG. 5.

FIG. 6 is a simplified waveform diagram that illustrates an operation of dither circuit 134 of FIG. 5. The waveforms P1-P4 illustrate various delayed phase versions of the input signal DIVOUT on the various taps 157-162 of the string of sequential logic elements. Initially, the three-bit DITHCONT value is a digital four such that multiplexer 163 is selected to couple the P4 signal on its "4" input lead to the multiplexer data output lead. The arrow 168 illustrates this coupling through multiplexer 163. There is a first time delay T1 between the first rising edge of DIVOUT and the first rising edge of DSMC. Then, on the falling edge of the signal DIVOUT, the three-bit DITHCONT value is changed from a digital "4" to a digital "3". Multiplexer 163 is now selected to couple the P3 signal on its "3" input lead to the multiplexer data output lead. The arrow 169 illustrates this coupling through multiplexer 163. There is a second time delay T2 between the second rising edge of DIVOUT and the second rising edge of DSMC. The changes in time delay between the rising edges of DIVOUT and the rising edges of DSMC constitute a dithering of the phase of the DSMC clock signal. If pseudo-random dithering is selected, then the three-bit values of DITHCONT are changed in a pseudo-random manner. If rotational dithering is selected, then the three-bit values of DITHCONT as incremented from zero to seven, and are then decremented from seven back down to zero, and this rotational incrementing and decrementing is repeated.

In one novel method, a clock signal that clocks a delta-sigma modulator of a fractional-N phase-locked loop is dithered. In the specific embodiment described above in connection with FIGS. 2-6, the phase of the clock signal DSMC on conductor 140 as supplied to delta-sigma modulator 132 is dithered. In one example, the overall receiver circuit is tested and characterized in a laboratory with the programmable clock dithering circuit 133 disabled to determine if a receive channel is being jammed due to digital noise generated by the delta-sigma modulator. If the receive channel is being jammed, then the programmable clock dithering circuit 133 is controlled via SPI bus 141 to dither the DSMC clock signal and to adjust the dithering such that the jamming is reduced or eliminated. Once the optimal settings of the programmable clock dithering circuit 133 are determined in this empirical manner in the laboratory, the settings are stored in production units of the receiver circuit such that when the receiver circuit is operating, the digital baseband IC 104 retrieves the settings and configures the programmable clock dithering circuit 133 in the RF transceiver IC 103 by communicating the settings across SPI bus 141. In another example, the settings of the programmable clock dithering circuit 133 are changed during receiver operation by the digital baseband integrated circuit 104 depending on the operational mode of the receiver.

Figure 7:
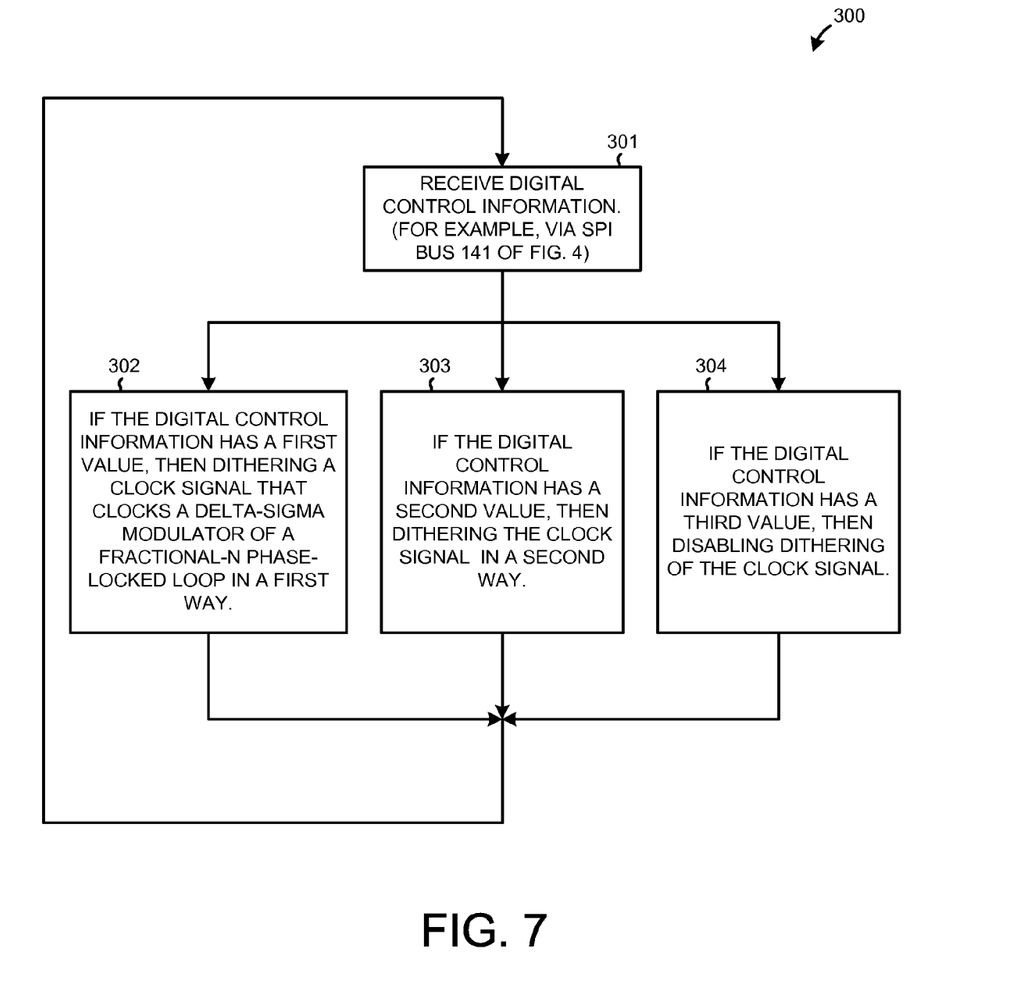
FIG. 7 is a flowchart of a method 300 in accordance with one novel aspect.

FIG. 7 is a flowchart of a novel method 300 in accordance with another novel aspect. Digital control information is received (step 301). The digital control information is, for example, received from digital baseband IC 104 via SPI bus 141 onto RF transceiver IC 103. If the digital control information has a first value, then a clock signal that clocks a delta-sigma modulator of a fractional-N PLL is dithered in a first way (step 302). In one example, the clock signal is clock signal DSMC of FIG. 4. If the digital control information has a second value, then the clock signal is dithered in a second way (step 303). If the digital control information has a third value, then dithering of the clock signal is disabled (step 304). The digital baseband IC 104 controls the manner of dithering of the clock signal in this way by sending RF transceiver IC 103 appropriate digital control information across SPI bus 141. The type of dithering performed can be changed during circuit testing and characterization and/or during normal operation of mobile communication device 100.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. In some embodiments, the programmable clock dithering circuit 133 is programmable to change the frequency of the DSMC clock signal. Although the dither circuit 134 of FIG. 5 involves a string of sequential logic elements, other ways of providing a series of phase delayed versions of an incoming clock signal can be employed to generate a phase-dithered output version of the clock signal. The order and/or rate of choosing different phases P1-P7 by multiplexer 136 in the rotational dithering mode can be made to be programmable. Rather than using a high frequency signal generated by the PLL itself as the high speed clock signal HSC that clocks dither circuit 134, in other embodiments a high frequency signal generated elsewhere is supplied to the PLL and is used as the high speed clock signal HSC. Use of the dithering technique described above is not limited to use in mobile communication devices or to use in radio receivers and transmitters, but rather has general applicability to other types of circuits that include fractional-N PLLs. The dithering of a clock signal supplied to a delta-sigma modulator can be varied from one type of dithering to another during circuit operation depending on an operating mode of the circuit of which the delta-sigma modulator is a part. Accordingly, various modifications, adaptations, and combinations of the various features of the described specific embodiments can be practiced without departing from the scope of the claims that are set forth below.

What is claimed is:

1. A phase-locked loop (PLL) circuit comprising:
   a phase detector that receives a reference clock signal and a feedback clock signal; and
   a loop divider that receives a first clock signal and that supplies the feedback clock signal to the phase detector, wherein the loop divider comprises:
      a delta-sigma modulator that outputs a multi-bit digital divisor value;
      a divider that receives the first clock signal and the multi-bit digital divisor value, and that outputs the feedback clock signal; and
      a clock dithering circuit that supplies a dithered clock signal to the delta-sigma modulator, wherein the clock dithering circuit comprises:
         a dither circuit comprising a multiplexer to select a dithering mode of operation from a group consisting of pseudo-random dithering and rotational dithering.

2. The PLL circuit claim 1, wherein the delta-sigma modulator changes the multi-bit digital divisor value over time such that the divider of the loop divider frequency divides the first clock signal by a fractional-N divisor to generate the feedback clock signal.

3. The PLL circuit of claim 1, wherein the dithered clock signal has a characteristic that is dithered in a pseudo-random fashion.

4. The PLL circuit of claim 1, wherein the dithered clock signal has a characteristic that is dithered in a smoothly-varying fashion.

5. The PLL circuit of claim 4, wherein the characteristic is a phase.

6. The PLL circuit of claim 1, wherein the dither circuit includes an amount of sequential digital logic that is clocked by a high speed clock signal.

7. The PLL circuit of claim 1, wherein the clock dithering circuit is programmable.

8. The PLL circuit of claim 1, wherein the clock dithering circuit receives the feedback clock signal, and wherein the clock dithering circuit also receives another clock signal, wherein the other clock signal has a frequency that is higher than a frequency of the feedback clock signal.

9. The PLL circuit of claim 1, wherein the PLL circuit is coupled to a serial bus interface circuit, wherein the serial bus interface circuit supplies digital control information to the clock dithering circuit.

10. The PLL circuit of claim 1, wherein the clock dithering circuit receives digital control information, wherein if the digital control information has a first value then the clock dithering circuit dithers the dithered clock signal in a first way, whereas if the digital control information has a second value then the clock dithering circuit dithers the dithered clock signal in a second way.

11. The PLL circuit of claim 1, wherein the clock dithering circuit receives digital control information, wherein if the digital control information has a first value then the clock dithering circuit outputs the dithered clock signal such that the dithered clock signal is not dithered, whereas if the digital control information has a second value then the clock dithering circuit outputs the dithered clock signal such that the dithered clock signal is dithered.

12. The PLL circuit of claim 1, wherein the clock dithering circuit receives digital control information, wherein if the digital control information has a first value then a characteristic of the dithered clock signal is dithered relatively rapidly, whereas if the digital control information has a second value then the characteristic of the dithered clock signal is dithered relatively slowly.

13. A circuit comprising:
a loop divider;
a delta-sigma modulator that receives a phase-dithered clock signal and that outputs a multi-bit digital value to the loop divider, wherein the loop divider and the delta-sigma modulator are parts of a phase-locked loop; and
a programmable clock dithering circuit that supplies the phase-dithered clock signal comprising a dither circuit, wherein the dither circuit comprises a multiplexer to select a dithering mode of operation from a group consisting of pseudo-random dithering and rotational dithering.

14. A method comprising:
selecting a dithering mode of operation from a group consisting of pseudo-random dithering and rotational dithering;
dithering a clock signal supplied to a delta-sigma modulator of a phase-locked loop in accordance with the selected dithering mode of operation, wherein said dithering a clock signal comprises:
clocking a plurality of sequential logic elements by a high speed clock signal; and
multiplexing an output from one of said plurality of sequential logic elements to the clock signal supplied to the delta-sigma modulator.

15. The method of claim 14, further comprising:
receiving a digital control signal, wherein the digital control signal value selects the dithering mode of operation.

16. The method of claim 15, wherein the digital control signal is changed from the first value to the second value.

17. The method of claim 14, wherein the clock signal is dithered such that the clock signal has a characteristic that is dithered in a pseudo-random fashion.

18. The method of claim 14, wherein the clock signal is dithered such that the clock signal has a characteristic that is dithered in a smoothly-varying fashion.

19. The method of claim 14, further comprising:
using the phase-locked loop in a receiver to receive a radio signal; and
adjusting the dithering of the clock signal supplied to the delta-sigma modulator of the phase-locked loop to reduce an amount of noise introduced into the receiver by the phase-locked loop.

20. The method of claim 14, wherein the dithering of the clock signal supplied to the delta-sigma modulator of the phase-locked loop is a dithering of a phase of the clock signal.

21. A circuit comprising:
a phase-locked loop comprising a loop divider, wherein the loop divider comprises:
a delta-sigma modulator; and
means for dithering a clock signal supplied to the delta-sigma modulator comprising means for generating a delta-sigma modulator clock signal (DSMC), wherein the means for generating a DSMC comprises means for selecting a dithering mode of operation from a group consisting of pseudo-random dithering and rotational dithering.

22. The circuit of claim 21, wherein the means is also for receiving digital control information, wherein the means for dithering a clock signal supplied to the delta-sigma modulator dithers the clock signal in a first way if the digital control information has a first value, whereas the means dithers the clock signal in a second way if the digital control information has a second value.

23. The circuit of claim 21, wherein the means for dithering a clock signal supplied to the delta-sigma modulator is also for receiving the digital control information from a serial bus.

24. A circuit, comprising:
means for selecting a dithering mode of operation from a group consisting of pseudo-random dithering and rotational dithering;
means for dithering a clock signal supplied to a delta-sigma modulator of a phase-locked loop in accordance with the selected dithering mode of operation, wherein said means for dithering a clock signal comprises:
means for clocking a plurality of sequential logic elements by a high speed clock signal; and
means for multiplexing an output from one of said plurality of sequential logic elements to the clock signal supplied to the delta-sigma modulator.

25. The circuit of claim 24, further comprising means for receiving a digital control signal, wherein the received digital control signal value selects the dithering mode of operation.

26. The circuit of claim 25, wherein the digital control signal is changed from the first value to the second value.

27. The circuit of claim 24, wherein the means for dithering a clock signal comprises means for dithering the clock signal in a pseudo-random fashion.

28. The circuit of claim 24, wherein the means for dithering a clock signal comprises means for dithering the clock signal in a smoothly-varying fashion.

29. The circuit of claim 24, further comprising:
means for using the phase-locked loop in a receiver to receive a radio signal; and
means for adjusting the means for dithering a clock signal to reduce an amount of noise introduced into the receiver by the phase-locked loop.

30. The circuit of claim 24, wherein the means for dithering a clock signal comprises means for dithering a phase of the clock signal.

31. A non-transitory processor-readable storage medium having stored thereon processor-executable software instructions configured to cause an electronic device processor to perform operations comprising:
selecting a dithering mode of operation from a group consisting of pseudo-random dithering and rotational dithering;
dithering a clock signal supplied to a delta-sigma modulator of a phase-locked loop in accordance with the selected dithering mode of operation;
clocking a plurality of sequential logic elements by a high speed clock signal; and
multiplexing an output from one of said plurality of sequential logic elements to the clock signal supplied to the delta-sigma modulator.

32. The non-transitory processor-readable storage medium of claim 31, wherein the stored processor-executable software instructions are configured to cause the electronic device processor to perform operations further comprising:
receiving a digital control signal, wherein the digital control signal value selects the dithering mode of operation.

33. The non-transitory processor-readable storage medium of claim 31, wherein the stored processor-executable software instructions are configured to cause the electronic device processor to perform operations further comprising:
dithering the clock signal in a pseudo-random fashion.

34. The non-transitory processor-readable storage medium of claim 31, wherein the stored processor-executable software instructions are configured to cause the electronic device processor to perform operations further comprising:
dithering the clock signal in a smoothly-varying fashion.

35. The non-transitory processor-readable storage medium of claim 31, wherein the stored processor-executable software instructions are configured to cause the electronic device processor to perform operations further comprising:

adjusting the dithering of the clock signal to reduce an amount of noise introduced into a receiver by the phase-locked loop.

36. The non-transitory processor-readable storage medium of claim 31, wherein the stored processor-executable software instructions are configured to cause the electronic device processor to perform operations further comprising:

dithering a phase of the clock signal.

* * * * *